Figure 1:
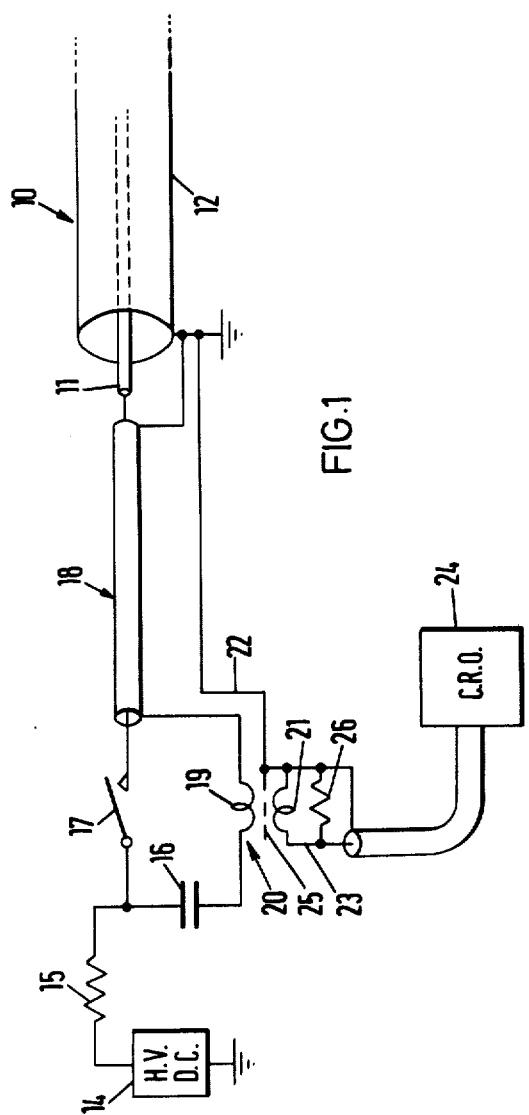

United States Patent [19]

Gale

[11] 4,165,482

[45] Aug. 21, 1979

[54] CABLE FAULT LOCATION

[75] Inventor: Philip F. Gale, Clwyd, Wales

[73] Assignee: The Electricity Council, London, England

[21] Appl. No.: 915,188

[22] Filed: Jun. 13, 1978

Related U.S. Application Data

[63] Continuation of Ser. No. 674,124, Apr. 6, 1976, abandoned.

[51] Int. Cl.² .......................................... G01R 31/08
[52] U.S. Cl. ................................. 324/52; 324/58 R
[58] Field of Search .................... 324/52, 58 R, 58 A, 324/58 B, 58 C, 133, 77 B

[56] References Cited

U.S. PATENT DOCUMENTS

| 3,588,693 | 6/1971 | Halley | 324/77 B |
| 3,909,712 | 9/1975 | Rietz | 324/52 |

FOREIGN PATENT DOCUMENTS

| 626407 | 8/1961 | Canada | 324/58 R |

Primary Examiner—M. Tokar
Attorney, Agent, or Firm—Buell, Blenko & Ziesenheim

[57] ABSTRACT

A fault in a cable comprising at least two conductors is located by applying a single voltage impulse between two conductors of the cable, passing the resultant current wave form through a primary winding of coupling means which comprises said primary winding and a secondary winding, the primary winding being connected in series between the impulse generator and one of said conductors and which obtains the derivative of said current wave form to give a signal output across the secondary winding, and displaying or recording the signal output. The signal output is a pulse of relatively short duration each time a reflection of the voltage impulse returns to the impulse generator. Preferably a digital transient recorder is used for recording the waveform of the resultant reflected signal from the cable.

19 Claims, 10 Drawing Figures

CABLE FAULT LOCATION

This application is a continuation of my copending application Ser. No. 674,124, filed Apr. 6, 1976, now abandoned.

This invention relates to the location of faults in electric cables.

Cable faults are diverse in nature and exhibit differing characteristics. It is possible to select a method of location according to the characteristics of the fault; this necessitates having the various different types of instruments from which the appropriate one has to be chosen. In recent years it has however become a practice to convert all faults as far as possible into a type which could be located using one technique; this is done by providing fault burning equipment in order to convert as far as possible all faults into stable low resistances. Most commonly such low resistance faults are then located by means of pulse echo equipment making use of a voltage pulse applied to the cable. Such techniques however do not locate flashing or intermittent faults unless they can be converted into a stable low resistance by the fault burner. Moreover even the most modern fault burning equipment cannot be relied upon to convert all faults into low resistance faults.

After measurement of the distance to the fault from one end of the cable, it is a convenient practice to determine the precise geographical location using an acoustic method; for this purpose a voltage impulse is applied to the cable and a microphone is moved over the ground to listen for the acoustic signals produced by the discharge at the fault. This however can only be done if the fault resistance has not been reduced to zero by fault burning.

It is an object of the present invention to provide an improved method of and apparatus for pre-locating a fault which does not require the pre-burning of faults before the use of the fault locating apparatus yet will detect and locate a wide variety of faults.

For this purpose, use is made of an impulse technique. Although impulse techniques have been known for a number of years, they have not been used except for the detection of flashing or intermittent faults. One of the problems in using an impulse technique without fault burning is that there is often a delay in the ionization of the fault. Various techniques have been proposed in the past to alleviate these problems. In particular, to deal with the ionization delay time, it has been proposed to measure not the time delay between the application of the impulse and the reception of a reflection thereof but to measure the time between later successive reflections. This however introduces further problems because of the increased rise-times of the later reflections. Not only is there distortion of the impulse front during transmission but there is a particular problem in detecting and displaying the resultant voltage waveform.

According to one aspect of this invention a method of locating a fault in a cable comprising at least two conductors, which method comprises the steps of applying a single voltage impulse between two conductors of the cable, passing the resultant current waveform through a primary winding of coupling means which comprises said primary winding and a secondary winding the primary winding being connected in series between the impulse generator and one of said two conductors, which coupling means obtains the derivative of said current waveform to give across the secondary winding a signal output which is a pulse of relatively short duration each time a reflection of the voltage impulse returns to the impulse generator, and displaying or recording said signal output.

According to another aspect of the invention apparatus for locating a fault in a cable comprising at least two conductors, which apparatus comprises an impulse generator with connecting means for applying a single voltage impulse between two conductors of the cable, a waveform display or recording device and, coupled between said connecting means and said display or recording device, a linear coupler comprising a primary winding and a secondary winding the primary winding being connected in the connecting means for connection in series between the impulse generator and one of said two conductors and the secondary winding having a damping resistor connected in shunt therewith, the arrangement being such that a linear coupler will obtain the derivative of the current waveform resulting from the application of a voltage impulse to the cable to give across the secondary winding a signal output which is a pulse of relatively short duration each time a reflection of the voltage impulse returns to the impulse generator.

One of the two conductors may comprise an earth or neutral conductor, e.g. a sheath, of the cable. In the case of a multi-core cable, for locating a fault in one core, the return conductor may comprise a further core. The linear coupler may be connected in series with a line conductor of the cable or the earth conductor.

If the cable has a fault with a resistance which changes the surge impedance profile of the cable or a fault which breaks down when the impulse is applied to the cable, then, with this apparatus, when an impulse signal is applied by the impulse generator to the cable, a waveform will arise which is dependent on the nature of the fault. With a low impedance fault, the reflected current will be of the same polarity as the applied impulse, and will cause current doubling at the impulse generator so producing a further step in the current waveform which is thus a succession of steps giving increasing current amplitude. The linear coupler however obtains the derivative of this waveform so giving a signal output which is a pulse of relatively short duration each time a reflection of the primary impulse returns to the impulse generator. Display of the waveform is thus simplified and made more convenient than with voltage displays such as have been suggested heretofore, and analysis can much more readily be effected. The rising frequency response of the coupler emphasises the high frequency components of the leading edges of the reflections and thus, in an oscilloscope display, optimises the use of the display area of the screen.

The impulse generator would commonly be connected to the cable to apply an impulse between one of the conductors in the cable and an earthed return. The linear coupler may be in series in the connection to the earthed return. Although, in some circumstances, the earthed return conductor can attain a significant potential above true earth, this arrangement has substantial advantages on grounds of safety both to the equipment and to operating personnel compared with prior types of arrangement making use of the voltage waveform between the conductor in the cable and the earthed return. Moreover an earthed electrostatic screen may be interposed between the two windings of the linear coupler to protect the instrumentation against any failure of the primary insulation.

The above-described fault location apparatus may be used not only for detecting low impedance faults but also for detecting a far wider range of fault conditions. The current waveforms obtained from an applied voltage impulse depend on the type of fault as will be explained later. It is convenient therefore to display the waveform to facilitate recognition of the type of fault as well as determination of the position of the fault. The display device may comprise an oscilloscope. Alternatively or additionally, a digital transient recorder may be used for recording the waveform of the resultant reflected signal from the cable, said digital transient recorder including means for regularly repetitively sampling the waveform to be recorded, analogue digital conversion means arranged to convert the sample signal amplitudes into digital form, and a digital store for recording the digitised sampled information.

Preferably, in addition to recording the waveform, a visual waveform display device, for example a cathode ray oscilloscope is provided for immediate visual display of the waveform. The stored information representing the waveform in digital form may be used for subsequent analysis. Provision may be made for transmitting the information in digital form to a remote location. The test apparatus may be portable or mobile, e.g. installed in a vehicle. The remote location may be a central station where the transmitted information may be compared with pre-recorded information representative of the waveform normally to be expected or it may be compared with pre-computed information representative of possible fault conditions or it may be displayed for visual analysis. At the central station, the transmitted information is conveniently received into a store. The equipment at such a central station and/or the test apparatus may therefore include means for feeding information read-out from the store to a digital-to-analogue converter to provide an analogue waveform and a display device arranged for displaying the analogue waveform from the converter. This display device may be, for example, a cathode ray oscilloscope or an automatic plotter.

The aforementioned digital store at the location of the generator may be a temporary store, for example a semi-conductor memory, and means may be provided for reading out the information in the store onto a permanent record, for example a paper tape or magnetic tape recorder.

By using a digital transient recorder, as described above, with a current impulse technique employing a linear coupler, the waveform can be examined at leisure to identify and analyse the type of fault.

The impulse generator may comprise a capacitor and a high voltage direct current source connected for charging said capacitor through a resistor, and a switch for connecting the high voltage side of said capacitor to a conductor of the cable under test, the low voltage side of said capacitor being connected via said primary winding to an earthed conductor of the cable.

The apparatus of the present invention is particularly suitable for use in the location of faults on underground power distribution cable networks. In such networks, due to the many branches and T junctions, complex conditions arise making analysis of waveforms difficult. Using the digital transient recorder, the necessary information is available in digital form. As explained above it may be transmitted to a central station or alternatively the digital data displayed in numerical form so that it may be readily communicated to a central station to permit of analysis in conjunction with detailed records of the cable network.

Figure 2A:
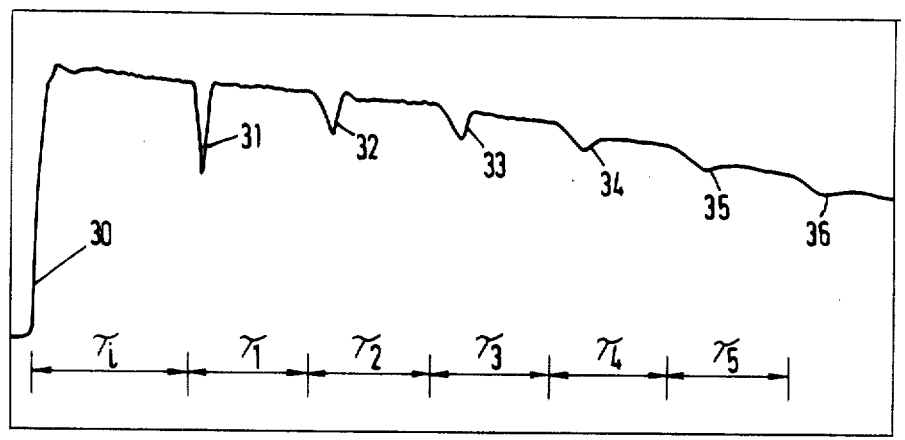
Figure 3A:
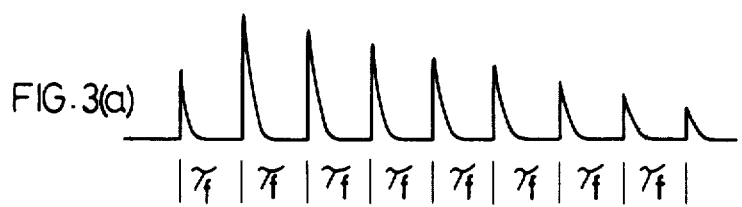

The following is a description, by way of example, of two embodiments of the invention, reference being made to the accompanying drawings, in which:

FIG. 1 is a schematic arrangement illustrating cable fault location apparatus forming one embodiment of the invention;

FIGS. 2(a), (b) and (c) are explanatory voltage and current waveform diagrams; and FIGS. 3(a), (b), (c), (d) and (e) illustrate output waveforms in the apparatus of FIG. 1 for different types of fault.

Figure 4:
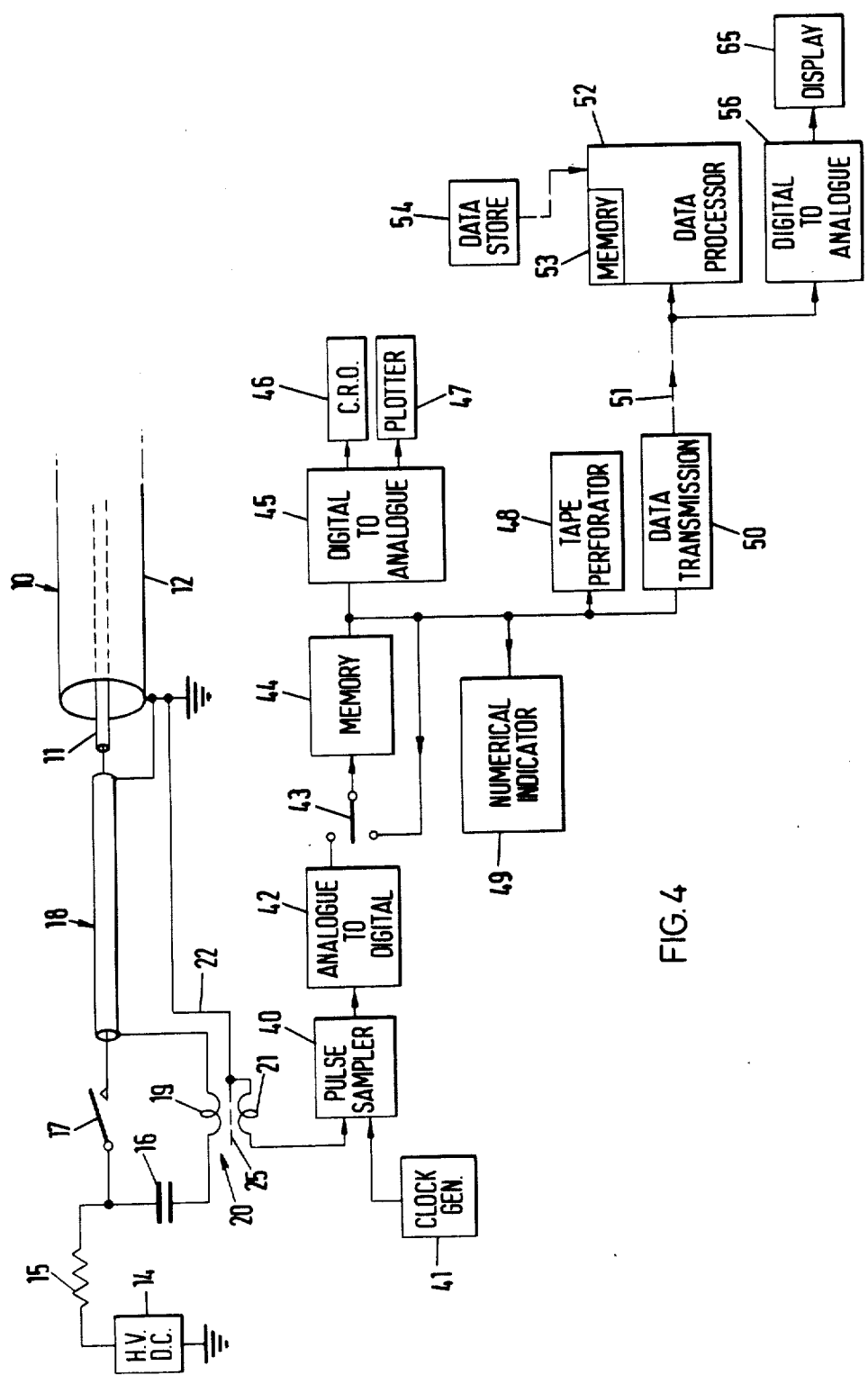

FIG. 4 is a schematic arrangement illustrating cable fault location apparatus forming a second embodiment of the invention in which a digital transient recorder is used for recording the waveform.

Referring to FIG. 1, the cable under test is shown at 10 and is illustrated diagrammatically as having a conductor 11 within an earthed outer conductor 12. It will be readily appreciated however that the method and apparatus of the present invention may be used for fault location on any type of cable provided two conductors are available to complete the circuit, the apparatus serving to locate low resistance or high resistance faults between the conductor or open circuit faults in the conductors.

The fault location apparatus comprises a high voltage d.c. power supply source 14 which is connected via a resistor 15 to charge a capacitor 16. A switch 17 is provided for connecting the high voltage side of the capacitor via a co-axial connector 18 to the line conductor 11 of the cable 10 under test. The other side of the capacitor is connected via a primary winding 19 of a linear coupler 20 and the connector 18 to the earthed conductor 12 of the cable 10. The linear coupler has a secondary winding 21, one end of which is earthed as shown at 22 and the other end of which is connected as shown at 23 to a cathode ray oscilloscope 24. An earthed electrostatic screen 25 is provided between the two windings of the linear coupler. A damping resistor 26 is connected in shunt across the secondary winding 21 of the linear coupler. In combination with the inductance of the secondary winding, the resistor 26 changes the frequency response; the component values are chosen to give a desired frequency response in which the circuit operates principally as a high-pass filter.

When an impulse voltage is applied to the cable, reflections occur from a fault and the voltage waveform is generally of the kind illustrated in FIG. 2(a). In apparatus displaying a voltage waveform, as distinct from the current waveform used in the apparatus of the present invention, a series choke has to be connected between the impulse generator and the cable. The display device, e.g. an oscilloscope, has to be connected across the circuit at a point between the choke and the cable. This is essential if the breakdown step is to be clearly visible on the display device and to provide a high impedance to reflections returning from the fault although it has the effect of increasing the rise time of the impulse front which reduces the possibility of breakdown. It also introduces the possibility of the arc at the fault not being maintained and gives rise to a waveform which is complex and difficult to analyse. FIG. 2(a) is a waveform diagram such as would be obtained with such a voltage waveform observing system. In this waveform, the sharp rise 30 indicates the application of the impulse voltage of the cable. The first reflection is received back at the input end of the cable after a time $\tau_i$ which depends not only on the propagation time along the cable to the fault and back but also includes ionization delay time in the fault. Subsequent reflected signals 32, 33, 34, 35, and 36 occur at later time intervals $\tau_1$, $\tau_2$ etc. Due to the attenuation and distortion, the amplitude of successive impulses is gradually decreased and the rise time of the leading edge increases so distorting the pulses. Successive impulses occur until either the fault de-ionises removing the reflecting point or until the system losses attenuate the reflections to zero.

Figure 2B:
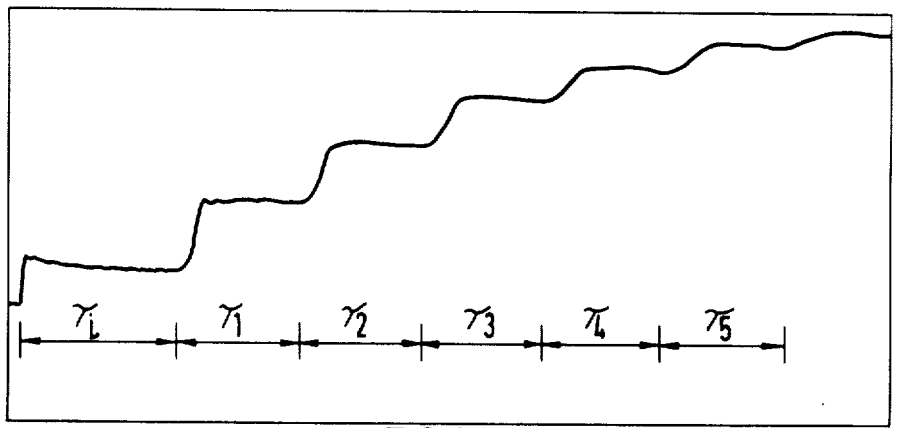

If one considers a current waveform measuring system, there is no need to a have a series choke. By omitting this series choke, the impulse generator presents a low impedance to the reflected impulses. Each returned impulse gives a current step of the same polarity as the applied impulse and this current step is reflected back at the low impedance of the impulse generator so that, as shown in FIG. 2(b), current doubling occurs at each step. Due to attenuation, the current is not exactly doubled but a staircase waveform is obtained. The current waveform of FIG. 2(b) was obtained using the same faulty cable as was used to obtain the voltage waveform of FIG. 2(a). The same impulse generator was used but the series choke, necessary to obtain the voltage waveform of FIG. 2(a), was omitted in obtaining the current waveform. The current was detected using a current shunt in the earth side of the impulse generator.

Figure 2C:
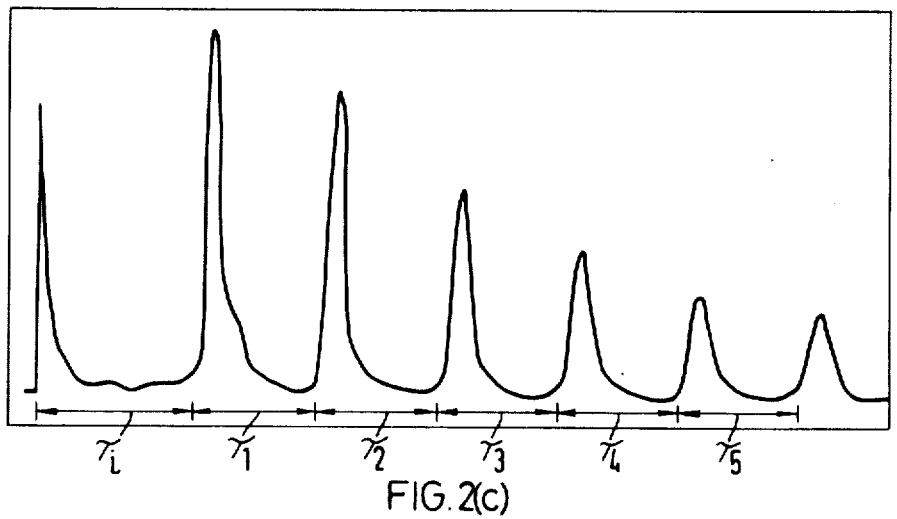

By use of the linear coupler 20, which effectively obtains the derivative of the current waveform before applying it to the memory and display unit 24, the output waveform obtained is of the form shown in FIG. 2(c). The rising frequency response of the linear coupler 20 emphasises the high frequency components of the leading edges of the reflections so producing a display readily suitable for multiple reflection analysis and which can much more conveniently be displayed or recorded than the stepped waveform of FIG. 2(b). The linear coupler also gives advantages on grounds of safety both to the equipment and to operating personnel. Under some circumstances the earth return conductor into which the linear coupler is connected can attain a significant potential above true earth but an earthed electrostatic screen interposed between the two windings protects the instrumentation against failure of the primary insulation. The rise in voltage of the earth return conductor causes a common mode voltage to appear on the signal from a current shunt placed any appreciable distance from the true earth point of the system, for example in a van connected onto the cable under test through say 50 meters of lead. This problem is eliminated with the linear coupler.

Figure 3B:
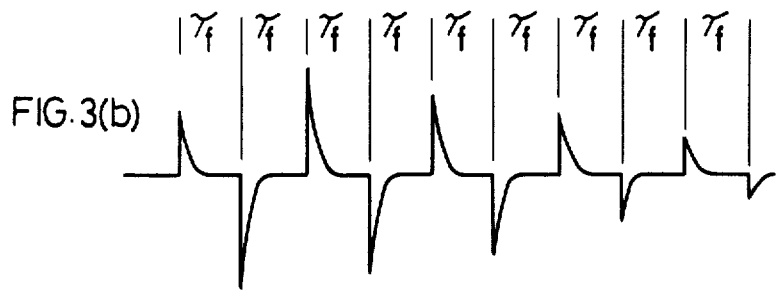
Figure 3C:
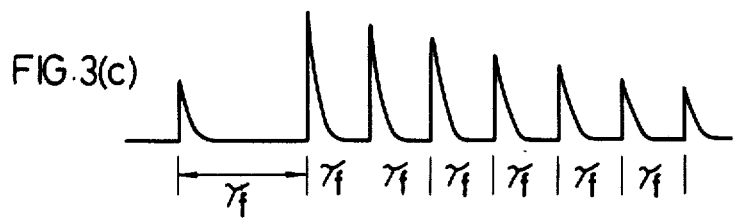
Figure 3D:
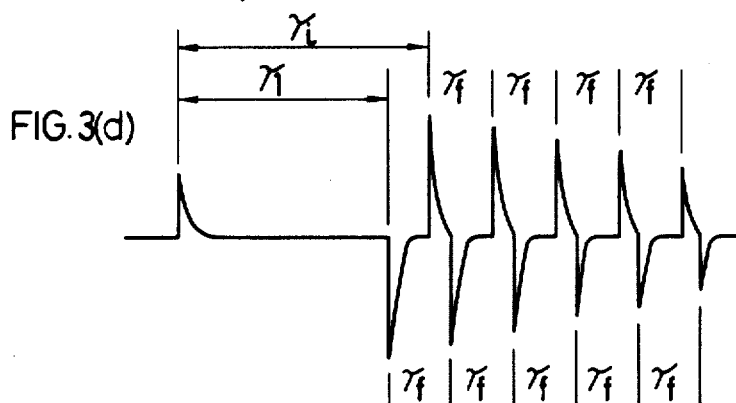

The actual waveform obtained will depend on the type of fault. The time intervals marked as $\tau_i$ contain some ionization delay time whilst the intervals marked as $\tau_f$ are purely transit times to fault. FIG. 3(a) shows the waveform from a very low resistance short circuit fault where the fault resistance $R_f < Z_o$ (the cable characteristic impedance). The fault is not being broken down in FIG. 3(a) and hence no acoustic signal is produced. FIG. 3(b), the waveform from an open circuit, shows a characteristic oscillatory form. FIG. 3(c) shows the waveform obtained from a fault which has broken down, the effect of the ionization delay time being very apparent. FIG. 3(d) also shows the waveform of a fault where the fault is being broken down but in this case breakdown does not occur until the impulse wave has passed the fault on its return journey from the open circuit at the far end of the cable, indicated by the negative pulse after time $\tau_1$. When a waveform like FIG. 3(d) is obtained the distance to the fault can be determined without any knowledge of the velocity of propagation from $$d = (\tau_f/\tau_1).l$$

Figure 3E:
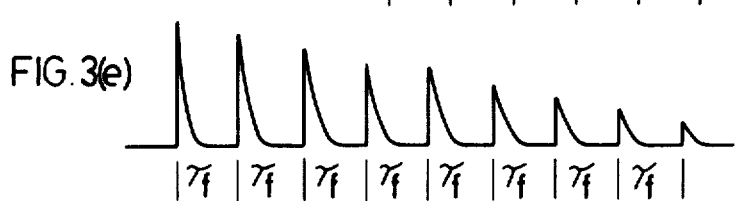

Occasionally faults are encountered which fail intermittently during a d.c. pressure test. These faults can be located if the impulse generator switching device is permanently closed and the generator capacitance is charged up together with the cable. Such faults, when they break down, give rise to waveforms similar to FIG. 3(e).

For open circuit or low resistance short circuit faults it is not necessary to apply as large a voltage to obtain a trace as for a high resistance fault. In fact, full variation of the output voltage of the impulse generator down to very low values is extremely useful as it enables some faults to be identified by comparison of the waveforms obtained at different voltage levels. The non-linearity exhibited by most faults makes it possible to compare a phase with itself in the sound and faulty states. This technique clearly has great merit when all three phases of a cable have similar faults on them, or when the three phases of a cable are not identical, for example where single phase branches are connected to different phases at various points along a three phase main.

Viewing the output current of an impulse generator by means of a linear coupler is thus a very effective method of producing easily interpreted waveforms for any type of cable fault. The production of simple waveforms, however, is of limited value unless accurate measurements can be made of the appropriate time intervals. Due to the low repetition rate of the signal it is desirable to provide some method of recording. The storage oscilloscope offers a significant improvement over the use of a conventional oscilloscope and camera, although the accuracy is limited since the whole of the transient has to be displayed within one screen width. Successive transients often show wide variations in form due to the statistical nature of the ionization delay time and it is therefore difficult to use a delayed sweep time base to provide an enlarged display of the section of interest.

Preferably, therefore, a digital transient recorder is employed and FIG. 4 illustrates a preferred cable fault location apparatus which incorporates such a recorder. Referring to FIG. 4, the apparatus differs from that illustrated in FIG. 1 in that the memory and display unit 24 is omitted and in that the secondary winding 21 of the linear coupler 20 is connected to a pulse sampler 40. The output signal from the linear coupler 20 is sampled at an accurately controlled rate typically 20 MHz in the sampler 40 controlled by a clock frequency signal generator 41 and the amplitudes of the output samples are converted from analogue to digital form in an analogue-to-digital converter 42, typically providing a 6-bit output thereby enabling 64 different amplitude levels to be recorded. The digital output from converter 42 is applied, via a switch 43, to a memory 44 which is typically a semi-conductor memory. When it is required to examine the waveform, the switch 43 is put in the re-play condition and the stored signal in memory 44 is fed both to a digital-to-analogue converter 45 and is also fed back via the switch 43 to be re-stored in the memory 44. The output of the digital-to-analogue converter 45 may be applied to a cathode ray oscilloscope 46 and/or to an automatic plotter 47. The stored signal in the memory may be fed to a paper tape perforator 48 to produce a permanent record. It may be fed to to numerical indicators 49 if numerical information is required, for example for communication to a remote station. The output of the memory additionally or alternatively may be applied to data transmission equipment 50 for feeding over a data link 51 to a central station.

The central station has a digital data processor 52 including a memory 53 for receiving the transmitted data. The incoming data can be compared in the processor with pre-recorded information representative of the waveform to be expected or precomputed information representative of possible fault conditions from a data store 54. Additionally or alternatively a display device 55 fed from a digital-to-analogue converter may be provided to enable the incoming data to be displayed visually in analogue form.

In operation, the complete waveform from an applied impulse would be stored in the memory and, when the recording cycle is complete, the stored data would be replayed through the digital-to-analogue converter 45. The re-play may be at a faster or slower rate than the original sampling and is usually made repetitive by recirculating the stored data through the switch 43 so that a steady trace is obtained on the display oscilloscope 46.

The transient recorder may incorporate post-trigger and/or pre-trigger recording facilities. In such cases the delays may be accurately controlled with pre-settable counters driven by the master sampling clock pulse generator. Pre-trigger recording is particularly valuable for viewing the leading edges of applied impulses whilst post-trigger recording can be used to offset the long ionization delay times shown by some faults.

When an oscilloscope is used to display the recorded waveform, it is possible to expand and shift the trace so that only the section of interest is displayed. With the apparatus described with reference to FIG. 4, the aforementioned presettable counters driven by the master sampling clock may be used to control a brightness modulation signal to brighten up part of the trace thereby identifying the time instant of the particular part of the trace displayed. As an alternative or additional facility, the stored numerical data selected on the aforementioned pre-settable counters can be displayed on indicator tubes. This enables the starting point of waves with very slow rise times and/or fall times to be more easily identified than by visual examination of the analogue output signal which is usually artificially smoothed through a low pass filter.

The sampling rate of the digital transient recorder governs the ultimate spacial resolution of the system. Recorders with sampling rates as high as 100 MHz are available which will give a resolution better than 1 meter. For practical purposes, however, due to the inaccuracies in route records and variations of cable parameters accuracy or this order cannot be expected and typically a sampling rate of 20 MHz might be employed.

The length of the memory 44 limits the ultimate range of the equipment at its maximum sampling rate. The maximum length of the memory 44 has to take into account not only the cable length but also fault ionization delay time. To make full allowance for the extremely long ionization delay times exhibited by some faults, a memory of at least 20,000 words might be required. However, post-trigger recording may be utilised to offset at least part of this delay and, if the range of the post-trigger delay is made ten times greater than the total sweep of the memory, a memory of 2,000 words length may be used.

A further advantage of the digital transient recorder is that, using digital techniques, complex waveforms may readily be compared. It is thus readily possible to apply impulses to a number of separate cores of a cable and to compare the waveforms digitally.

Particularly however it will be noted that the digital technique permits of accurate measuring of the time interval between successive reflected signals.

As mentioned previously, provision may be made for remote transmission of the data in the transient recorder to a central location. At that location, it may be compared in the data processor 53 with pre-stored data or pre-computed data from data store 54 relating to a cable network or analysed in other ways. In particular computer-stored data can be maintained at the central location for automatic comparison purposes.

What I claim as my invention is:

1. A method of locating a fault in a cable comprising at least two conductors which method comprises the steps of applying from an impulse generator a single voltage impulse between two conductors of the cable, passing the resultant current waveform through a primary winding of coupling means which comprises said primary winding and a secondary winding, the primary winding being connected in series between the impulse generator and one of said two conductors, which coupling means obtains the derivative of said current waveform to give across the secondary winding a signal output which is a pulse of relatively short duration each time a reflection of the voltage impulse returns to the impulse generator, and displaying or recording said signal output.

2. A method of locating a fault in a cable comprising at least two conductors, which method comprises the steps of applying from an impulse generator a single voltage impulse between two conductors of the cable, passing the resultant current waveform through a primary winding of a linear coupler which comprises said primary winding and a secondary winding, the primary winding being connected in series between the impulse generator and one of said two conductors and the secondary winding having a damping resistor connected in shunt therewith, which linear coupler obtains the derivative of said current waveform to give across the secondary winding a signal output which is a pulse of relatively short duration each time a reflection of the voltage impulse returns to the impulse generator, and displaying or recording said signal output.

3. Apparatus for locating a fault in a cable comprising at least two conductors, which apparatus comprises an impulse generator with connecting means for applying a single voltage impulse between two conductors of the cable, a waveform display or recording device and, coupled between said connecting means and said display or recording device, linear coupler comprising a primary winding and a second winding, the primary winding being connected in the connecting means for connection in series between the impulse generator and one of said two conductors and the secondary winding having a damping resistor connected in shunt therewith, the arrangement being such that said linear coupler will obtain the derivative of the current waveform resulting from the application of a voltage impulse to the cable to give across the secondary winding a signal output which is a pulse of relatively short duration each time a reflection of the voltage impulse returns to the impulse generator.

4. Apparatus as claimed in claim 3, wherein the linear coupler is connected in series with a line conductor of the cable.

5. Apparatus as claimed in claim 3, wherein the linear coupler is connected in series with the earth return conductor.

6. Apparatus as claimed in claim 3, wherein an electrostatic screen is provided between the primary and secondary windings of the linear coupler.

7. Apparatus for locating a fault in a cable comprising at least two conductors, which apparatus comprises an impulse generator with connecting means for applying a single voltage impulse between two conductors of the cable, a digital transient recorder for recording the waveform of the resultant reflected signal from the cable and, coupled between said connecting means and said digital transient recorder, a linear coupler comprising a primary winding and a secondary winding, the primary winding being connected in the connecting means for connection in series between the impulse generator and one of said two conductors and the secondary winding having a damping resistor connected in shunt therewith, the arrangement being such that said linear coupler will obtain the derivative of the current waveform resulting from the application of a voltage impulse to the cable to give across the secondary winding a signal output which is a pulse of relatively short duration each time a reflection of the voltage impulse returns to the impulse generator, said digital transient recorder including means for regularly repetitively sampling the waveform to be recorded, analogue digital conversion means arranged to convert the sample signal amplitudes into digital form, and a digital signal store for recording the digitised sampled information.

8. Apparatus as claimed in claim 7, which includes a visual waveform display device for immediate visual display of the waveform.

9. Apparatus as claimed in claim 8, wherein the visual waveform display device is a cathode ray oscilloscope.

10. Apparatus as claimed in claim 7, which includes means for transmitting the information in digital form to a remote location.

11. Apparatus as claimed claim 10 in combination with means at said remote location for comparing the transmitted information representative of the waveform normally to be expected or with pre-computed information representative of possible fault conditions.

12. Apparatus as claimed in claim 10, which includes means at said remote station for displaying the transmitted information for visual analysis.

13. Apparatus as claimed in claim 10, which includes a store at said remote location arranged to receive the transmitted information.

14. Apparatus as claimed in claim 7, which includes means for feeding information read-out from the store, at the location of the generator or at said remote location, to a digital-to-analogue converter to provide an analogue waveform and a display device arranged for displaying the analogue waveform from the converter.

15. Apparatus as claimed in claim 7, wherein said digital store at the location of the generator is a temporary store and wherein means are provided for reading out the information in that store onto a permanent record.

16. Apparatus as claimed in claim 3, wherein said display device comprises a cathode ray oscilloscope.

17. Apparatus as claim in claim 3, wherein the impulse generator comprises a capacitor and a high voltage direct current source connected for charging said capacitor through a resistor, and a switch for connecting the high voltage side of said capacitor to a conductor of the cable under test, the low voltage side of said capacitor being connected via said primary winding to an earthed conductor of the cable.

18. A method as claimed in claim 1, wherein one of said two conductors comprises an earth or neutral conductor of the cable.

19. A method as claimed in claim 1, for locating a fault in one core of a multicore cable, wherein one of the said two conductors comprises a further core of the cable.

* * * * *